United States Patent
Ho

(10) Patent No.: US 9,117,673 B2
(45) Date of Patent: Aug. 25, 2015

(54) ELECTROSTATIC DISCHARGE PROTECTION CIRCUIT INCLUDING A PLURALITY OF DOPED REGIONS AND A GATE CONNECTED TO A CAPACITOR AND A RESISTOR

(75) Inventor: Yung-Hang Ho, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/602,987

(22) Filed: Sep. 4, 2012

(65) Prior Publication Data

US 2014/0061740 A1  Mar. 6, 2014

(51) Int. Cl.
| | |
|---|---|
| H01L 29/66 | (2006.01) |
| H01L 23/62 | (2006.01) |
| H01L 27/02 | (2006.01) |
| H01L 29/74 | (2006.01) |
| H01L 29/87 | (2006.01) |

(52) U.S. Cl.
CPC ........ *H01L 27/0262* (2013.01); *H01L 29/7436* (2013.01); *H01L 29/87* (2013.01)

(58) Field of Classification Search
USPC .......................... 257/173, 328, 355, 360, 546
See application file for complete search history.

(56) References Cited

U.S. PATENT DOCUMENTS

| | | | | |
|---|---|---|---|---|
| 6,671,153 | B1* | 12/2003 | Ker et al. | 361/111 |
| 2002/0037621 | A1* | 3/2002 | Kawazoe et al. | 438/296 |
| 2002/0050615 | A1* | 5/2002 | Ker et al. | 257/355 |
| 2002/0084490 | A1* | 7/2002 | Ker et al. | 257/355 |
| 2004/0027743 | A1* | 2/2004 | Higashi et al. | 361/56 |
| 2004/0100746 | A1* | 5/2004 | Chen et al. | 361/56 |
| 2007/0018193 | A1* | 1/2007 | Ker et al. | 257/119 |
| 2010/0090283 | A1* | 4/2010 | Langguth et al. | 257/355 |

* cited by examiner

*Primary Examiner* — Mamadou Diallo
*Assistant Examiner* — Jay C Chang
(74) *Attorney, Agent, or Firm* — J.C. Patents

(57) ABSTRACT

An ESD protection device is described, including a substrate of a first conductivity, a well of a second conductivity, a transistor including a first doped region of the second conductivity located in the substrate and extending into the well, a second doped region of the first conductivity and a gate over the substrate between the two doped regions, a third doped region of the second conductivity and a fourth doped region of the first conductivity disposed in the substrate in sequence from an outer side of the second doped region and coupled to ground, and a fifth doped region of the first conductivity and a sixth doped region of the second conductivity disposed in the well in sequence from an outer side of the first doped region and coupled to a bonding pad. When an ESD voltage is applied to the bonding pad, it is coupled to the gate.

18 Claims, 6 Drawing Sheets

US 9,117,673 B2

ELECTROSTATIC DISCHARGE PROTECTION CIRCUIT INCLUDING A PLURALITY OF DOPED REGIONS AND A GATE CONNECTED TO A CAPACITOR AND A RESISTOR

BACKGROUND OF THE INVENTION

1. Field of Invention

This invention relates to an electrostatic discharge (ESD) protect circuit, and particularly to an ESD protect circuit of which the breakdown speed can be adjusted.

2. Description of Related Art

ESD means movement of electrostatic charges from a non-conductive surface, which easily damages the semiconductor and other circuit components in integrated circuits. For example, when an ordinary charged body, such as a human body walking on a carpet or a machine for packaging or testing integrated circuits, contacts a chip, it will discharge electricity to the chip. The transient power of the ESD will possibly cause damage or failure of the integrated circuits in the chip.

To prevent damage of ICs by ESD, ESD protect circuits are usually included in an IC. There are various designs for ESD protect circuits, wherein an ordinary design includes two N-type transistors connected in series, of which the gate electrodes are biased with a constant voltage. However, the holding voltage of the discharge path provided by such scheme is usually lower than 10.5 V, so that electrical overstress (EOS) events may occur frequently in operation of the internal circuits to disturb the same.

Hence, it is important in the industry to design and fabricate an ESD protection device that does not disturbing normal operation of the internal circuits.

SUMMARY OF THE INVENTION

In view of the foregoing, this invention is intended to provide an ESD protection device, of which the SCR (Silicon Controlled Rectifier) can be triggered rapidly.

This invention is also intended to provide an ESD protection device that allows reduction of the distance between the anode and the cathode to save the layout area, without adversely affecting the turn-on speed.

This invention is further intended to provide an ESD protection device in which the breakdown speed of the transistor can be adjusted by controlling the distance between the gate and a neighboring doped region.

The ESD protection device of this invention includes a substrate of a first conductivity type, a well of a second conductivity type in the substrate, a transistor that includes a first doped region of the second conductivity type located in the substrate and extending into the well, a second doped region of the first conductivity type located in the substrate and neighboring to the first doped region, and a gate, a third doped region of the second conductivity type in the substrate, a fourth doped region of the first conductivity type in the substrate, a fifth doped region of the first conductivity type in the well, and a sixth doped region having the second conductivity type in the well. The gate is disposed over the substrate between the first doped region and the second doped region. The third doped region is located between the second doped region and the fourth doped region. The fifth doped region is located between the first doped region and the sixth doped region. The fifth doped region and the sixth doped region are coupled to a bonding pad. The third doped region and the fourth doped region are coupled to a ground terminal. When an ESD voltage is applied to the bonding pad, the ESD voltage is coupled to the gate.

In an embodiment of this invention, there is a distance between the gate and the second doped region. In another embodiment, the gate is located adjacent to or overlapping with the second doped region.

In some embodiments, the bonding pad is coupled to the ground and the gate via a circuit, so that the ESD voltage applied to the bonding pad is coupled to the gate.

Accordingly, the ESD protection device of this invention not only allows the SRC thereof to be triggered more rapidly, but also allows reduction of the distance between the anode and the cathode to save the layout area, without adversely affecting the turn-on speed. Moreover, in the ESD protection device of this invention, the breakdown speed of the transistor can be adjusted by controlling the distance between the gate and a neighboring doped region.

In order to make the aforementioned and other objects, features and advantages of this invention comprehensible, a preferred embodiment accompanied with figures is described in detail below.

BRIEF DESCRIPTION OF THE DRAWINGS

FIGS. 1C and 1D illustrate the energy level diagrams of the transistor before and after the ESD protection device is turned on.

FIGS. 2B and 2C schematically illustrate the depletion regions under the gate of the transistor before and after the ESD protection device is turned on.

DESCRIPTION OF EMBODIMENTS

Figure 1A:
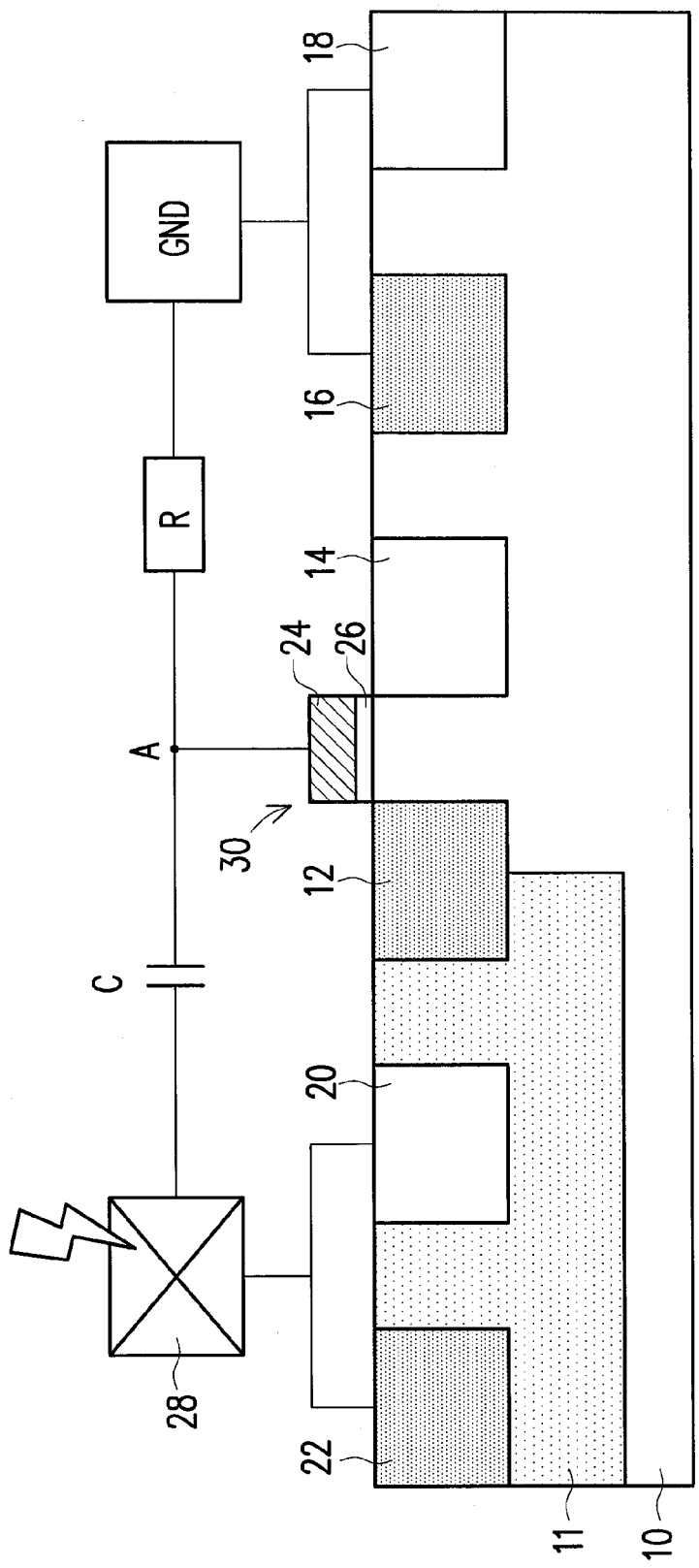
FIG. 1A schematically illustrates an ESD protection device according to an embodiment of this invention.

Referring to FIG. 1A, the ESD protection device includes a well 11 in a substrate 10, a plurality of doped regions (14, 18 and 20) of a first conductivity type, a plurality of doped regions (12, 16 and 22) of a second conductivity type, and a gate electrode 24 disposed over the substrate 10. More specifically, the ESD protection device includes a substrate 10, a well 11, a transistor 30 that includes a gate 24, a first doped region 12 and a second doped region 14, a third doped region 16, a fourth doped region 18, a fifth doped region 20 and a sixth doped region 22.

The well 11 is located in the substrate 10. The substrate 10 may be a single-element semiconductor substrate like a silicon substrate, or a semiconductor compound substrate. In an embodiment, the substrate 10 has a first conductivity type and the well 11 has a second conductivity type. In an embodiment, the first conductivity type is P-type and the second conductivity type is N-type. The P-type dopant may be boron. The N-type dopant may be phosphorous or arsenic.

In this embodiment, the transistor 30 is a transformed transistor, including a gate 24, a first dope region 12 of the second conductivity type, and a second doped region 14 of the first conductivity type. The first doped region 12 is located in the substrate 10 and extends into the well 11. The second doped region 14 is located in the substrate 10, and is neighboring to the first doped region 12 with a distance therebetween. The gate 24 is disposed over her substrate 10 between the first doped region 12 and the second doped region 14. The gate 24 includes a conductive material, such as doped poly-Si, metal silicide, or a stacked layer of the two. In addition, a gate dielectric layer 26 is disposed between the gate 24 and the substrate 10, possibly including silicon oxide, silicon nitride, or a high-k material with a dielectric constant of 4.0 or more.

The third doped region 16 and the fourth doped region 18 are located in the substrate 10 at the outer side of the second doped region 14, having the second conductivity type and the first conductivity type, respectively, wherein the third doped region 16 is located between the second doped region 14 and the fourth doped region 18. The third doped region 16 and the fourth doped region 18 are electrically connected to the ground terminal GND, possibly after being electrically connected with each other.

The fifth doped region 20 and the sixth doped region 22 are located in the well 11 at the outer side of the first doped region 12, having the first conductivity type and the second conductivity type, respectively, wherein the fifth doped region 20 is located between the first doped region 12 and the sixth doped region 22. The fifth doped region 20 and the sixth doped region 22 are electrically connected to a bonding pad 28, possibly after being electrically connected with each other.

Moreover, the fifth doped region 20 electrically connected to the bonding pad 28 serves as the anode of the SCR constituted by the third doped region 16, the substrate 10, the well 11 and the fifth doped region 20, while the third doped region 16 electrically connected to ground serves as the cathode of the same SCR. Concurrently, the doped regions 22 and 18 form a reverse diode to prevent leakage current.

The bonding pad 28 serves as an input terminal and receives input signals (in normal operations). When an ESD event occurs, the high voltage (Hi) of the ESD is applied to the bonding pad 28 to trigger the SCR ESD protection circuit. In addition, the bonding pad 28 can be electrically connected to the ground terminal GND via a RC circuit including a capacitor C and a resistor R. The gate 24 is coupled to a node A where the capacitor C and the resistor R is electrically connected.

Briefly speaking, in operation of the above ESD protection device under ESD, because the high voltage of ESD usually has an HF (high frequency) characteristic, it is coupled to the gate 24 via the capacitor C while the capacitor C is in a short state. This rapidly lowers the breakdown voltage of the transistor 30, so the ESD protection circuit device is turned on to protect the inner circuits. In normal operation, the capacitor C of the RC circuit becomes an open circuit, and the gate 24 typically has the ground voltage. Hence, the transistor 30 acts like a reverse diode and does not breakdown, so the ESD protection circuit is not turned on affecting the operation of the inner circuits.

Figure 1B:
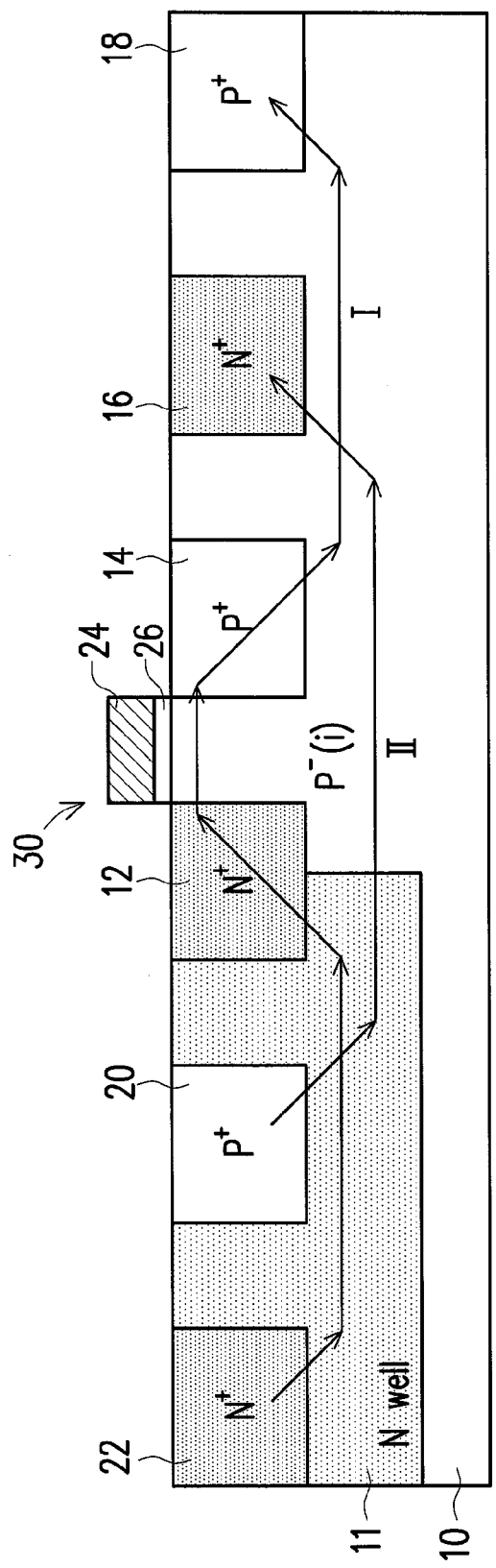
FIG. 1B schematically illustrates the electrical current path in operation of the ESD protection device.
Figure 1C:
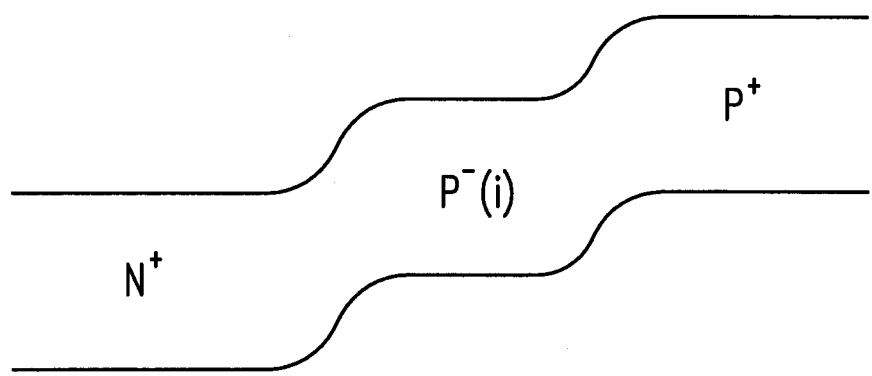
Figure 1D:
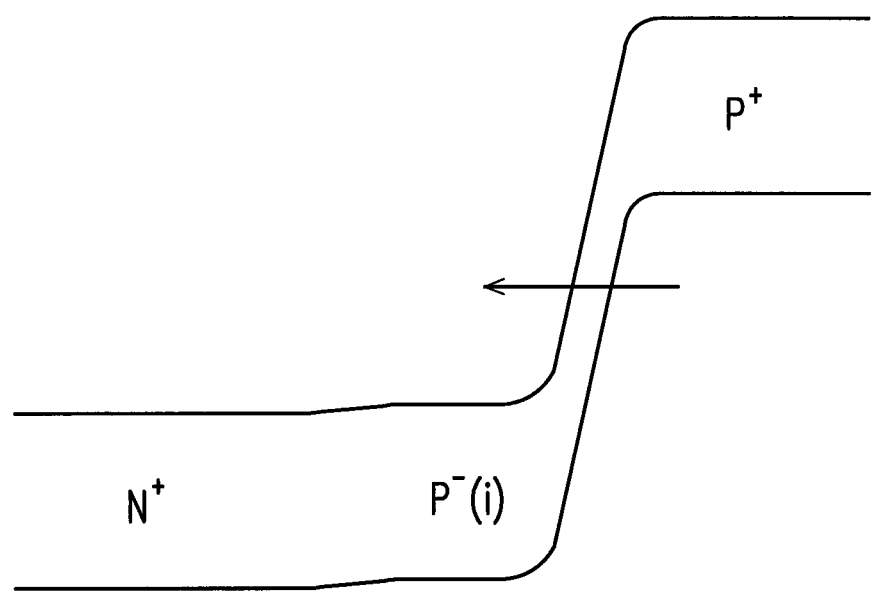

The operation principles of the ESD protection device are described as follows in reference of FIGS. 1B-1D, wherein FIG. 1B schematically illustrates the electrical current path in operation of the ESD protection device, and FIGS. 1C-1D illustrate the energy level diagrams of the transistor before and after the same device is turned on.

Referring to FIG. 1B, in an embodiment, the first conductivity type is P-type and the second one is N-type. That is, the first doped region 12, the third doped region 16 and the sixth doped region 22 are $N^+$-doped regions, and the second doped region 14, the fourth doped region 18 and the fifth doped region 20 are $P^+$-doped regions. Thus, the $N^+$-doped regions and the $P^+$-doped regions are arranged alternately in the substrate 10. The portion of the substrate 10 between the first doped region 12 as an $N^+$-doped region and the second doped region 14 as a $P^+$-doped region and under the gate 24 is a $P^-$(i)-doped region, and the Fermi energy level (simplified as "energy level" hereinafter) distribution of these doped regions are shown in FIGS. 1C-1D, wherein FIG. 1C shows the energy level distribution in normal operation of the IC, and FIG. 1D shows the energy level distribution when an ESD event occurs.

Referring to FIG. 1C, in the normal operation, the potential difference between the $P^-$(i)-region and the $P^+$-region is small. Meanwhile, the energy band between the two regions is wide, so that tunneling through the energy band is difficult and a current doe not occurs substantially. As a result, SCR device is substantially not turned on.

When an ESD event occurs on the bonding pad 28, the high voltage of the ESD is coupled to the gate 24 of the transistor 30 via the above RC circuit, and the energy levels of the transistor 30 is changed as shown in FIG. 1D. The energy level of $P^-$(i) is lowered while that of $P^+$ raised, so that the energy band between the $P^-$(i)-region and the $P^+$-region is narrowed, and tunneling easily occurs to cause a current and turn on the SCR device to protect the internal circuits.

Referring to FIG. 1B, in the initial stage of the ESD event, electrons and holes are generated in the substrate 10 under the gate 24. The electrons will flow along the path constituted by the first doped region 12 of N-type, the N-well 11 and the sixth doped region 22 of N-type. The holes will flow along the path (first discharge path I) constituted by the second doped region 14 of P-type, the P-substrate 10 and the fourth doped region 18 of P-type. Thereby, an electrical current flows to the ground terminal along the discharge path I.

When the ESD voltage is further raised, the path constituted by the third doped region 16 of N-type, the P-substrate 10 and the N-well 11 (NPN) is turned on, and then the path constituted by the P-substrate 10, the N-well 11 and the fifth doped region 20 of P-type (PNP) is turned on, so that a second discharge path (path II) is formed.

Briefly speaking, when an ESD event occurs at the bonding pad 28, the high voltage of the ESD is coupled to the gate 24 via the capacitor C of the RC circuit, so that the SCR circuit is triggered and a current can flow to the ground terminal along the paths I and II. The triggering current goes through the path I at first, but once the SCR turns on (path II), the triggering current (path I) will no loner exist.

In the above embodiment, the gate 24 is disposed adjacent to or overlapping with the second doped region 14. In operation of the ESD protection device, the high voltage of the ESD is coupled to the gate 24 via the capacitor C of the RC circuit to immediately form a channel in the substrate under the gate 24, which electrically connects the first doped region 12 and the second doped region 14. Nevertheless, in another embodiment, the length L of the gate 24 can be reduced, such that a distance D is present between the gate 24 and the second doped region 14, as shown in FIG. 2A.

Figure 2A:
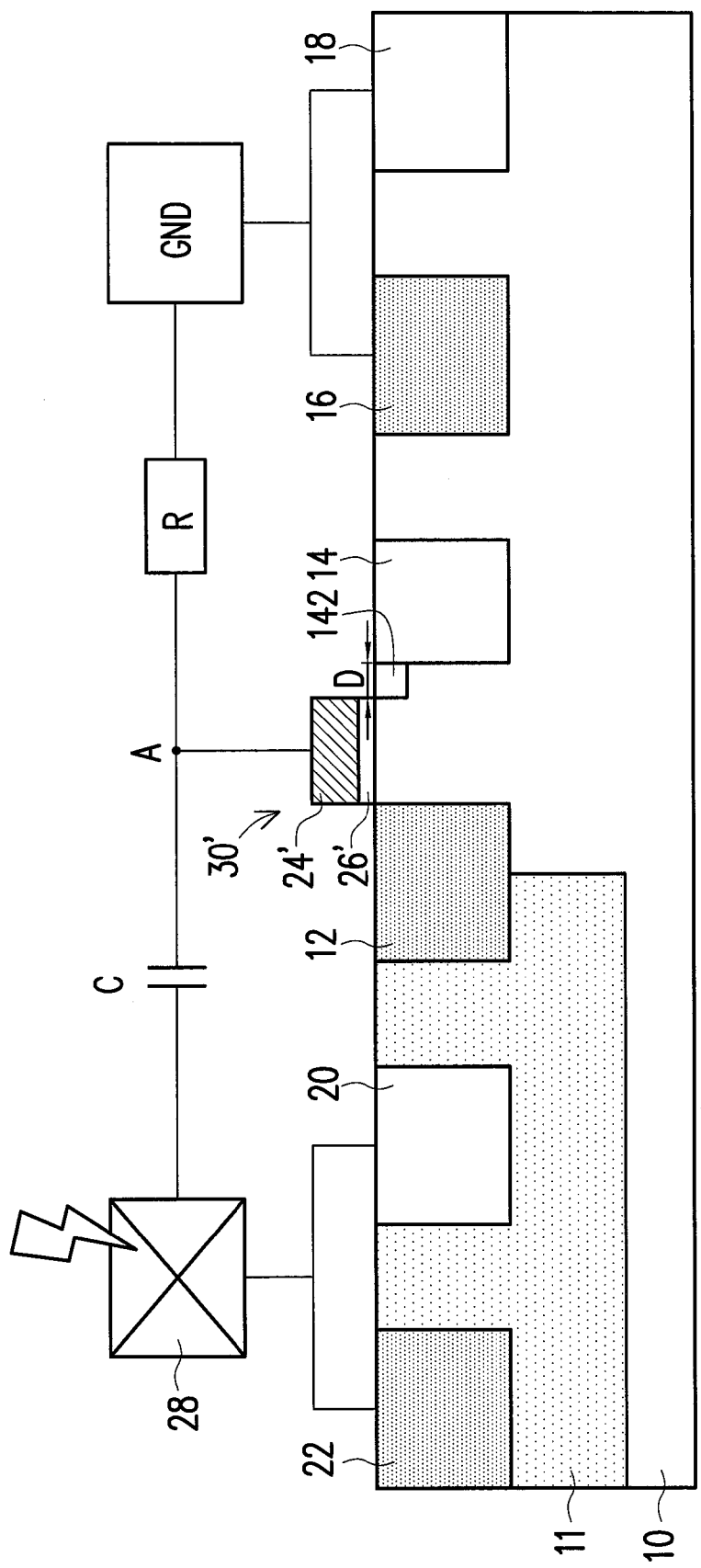
FIG. 2A schematically illustrates an ESD protection device according to another embodiment of this invention.

FIG. 2A schematically illustrates an ESD protection device according to another embodiment of this invention.

Referring to FIG. 2A, in this embodiment, the ESD protection device also includes the well 11 and the doped regions 12, 14, 16, 18, 20 and 22 in the substrate 10, and the gate 24 disposed over the substrate 10. More specifically, the ESD protection device according to this embodiment includes the well 11, a transistor 30' including a gate 24', a gate dielectric layer 26' the first doped region 12 and the second doped region 14, the third doped region 16, the fourth doped region 18, the fifth doped region 20, and the sixth doped region 22, wherein a distance D is present between the gate 24' and the second doped region 14. Moreover, there may be a light doped region 142 that has the same conductivity type as the second doped region 14 and is located in the substrate 10 between the gate 24' and the second doped region 14. The distance D may at range of several nanometers depended on the designed breakdown voltage.

The operation principles of the ESD protection device according to the second embodiment are described as follows in reference of FIGS. 2B-2C, which schematically illustrate the depletion regions under the gate of the transistor before and after the ESD protection device is turned on.

Figure 2B:
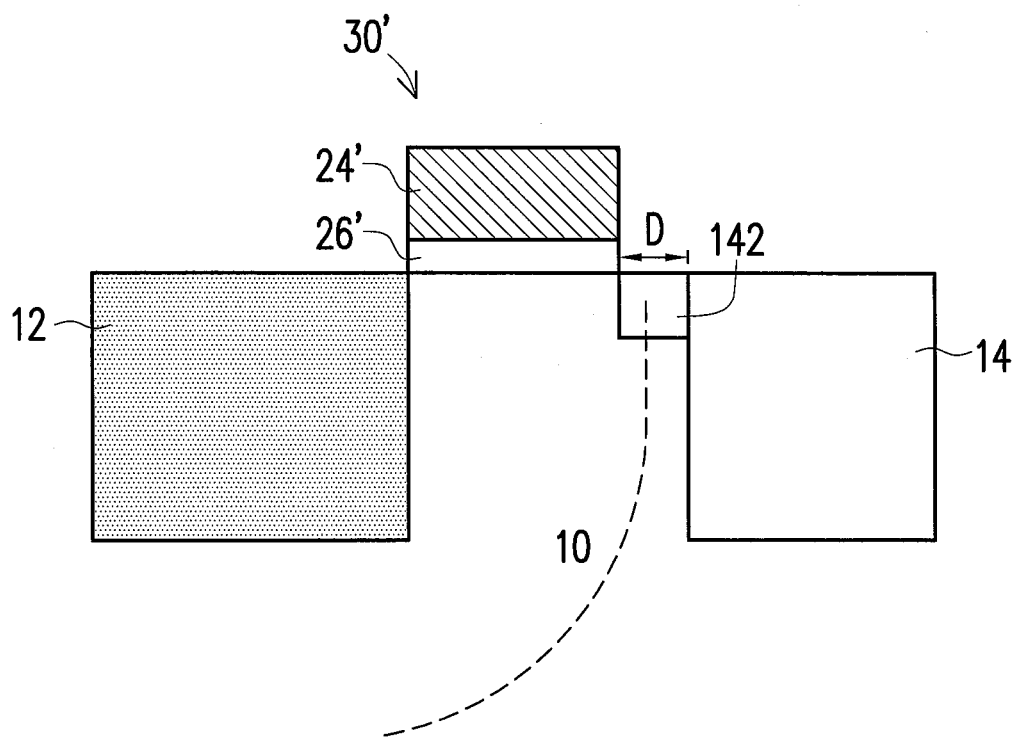
Figure 2C:
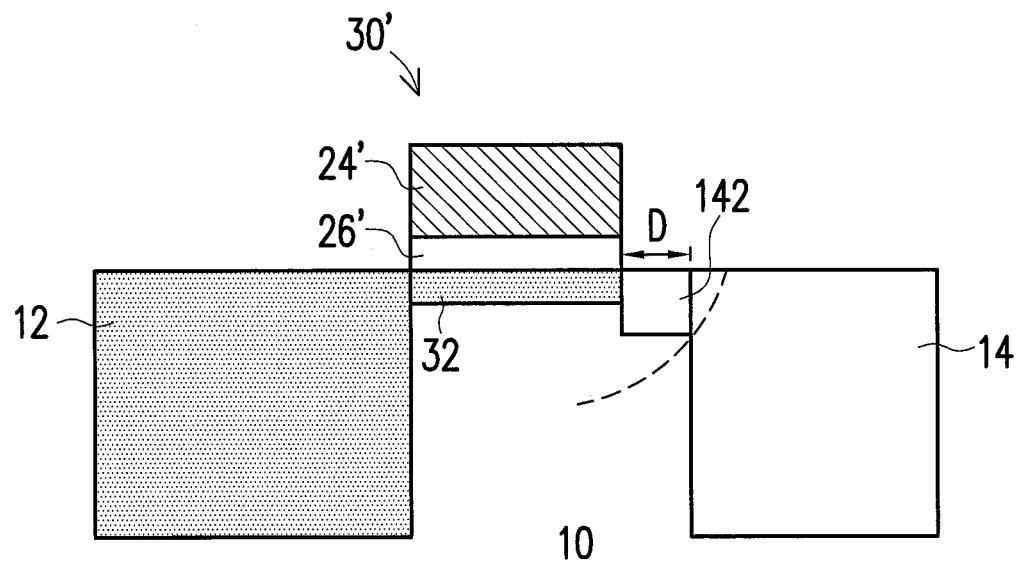

Referring to FIG. 2B, the situation of normal operation is described first. In the normal operation, the breakdown voltage of the transistor 30 is relatively high, and the gate 24 is assumed to be grounded. The energy level diagram at the part of the transistor 30 is the same as that shown in FIG. 1C, wherein the potential difference between the $P^-$(i)-region and the $P^+$-region is small, and the energy band between the two regions is wide. Thus, tunneling through the energy band is difficult and a current doe not occurs substantially, so that the SCR device is substantially not turned on.

When an ESD event occurs, the high voltage of the ESD is coupled to the gate 24, and the $P^-$(i)-region under the gate 24 is inverted to form a virtual drain 32. The potential of the $N^+$-drain will be fully brought to the virtual drain, so that the transistor 30 rapidly breakdowns to trigger the ESD protection circuit. It is also noted that the distance between the gate 24 and the second doped region 14 can be utilized to adjust the breakdown speed of the transistor 30. The smaller (or greater) the distance D between the gate 24 and the second doped region 14 is, the higher (or lower) the breakdown speed of the transistor 30 is. Accordingly, with the shorter gate 24', the SCR device will breakdown rapidly when an ESD event occurs, and breakdowns very slowly in normal operation, that is, breakdowns under a certain condition causing breakdown, just like a normal device does.

The protection mechanisms of the above embodiments include early breakdown and tunneling, and the SCR device will be triggered rapidly with several nanoseconds by the two mechanisms. Moreover, the length of the gate 24' can be reduced to tens of nanometers so that the SCR device can be triggered within one nanosecond.

In the above description for FIG. 1, there is a RC circuit between the bonding pad 28, the gate 24 and the ground GND, which is illustrated in a simplest way with a single capacitor C and a single resistor R. Use of a RV circuit is usually for the protection between VDD and GND, because the raise of VDD is slow. However, in an ordinary input terminal, the raise of the input signal is very rapid so that whether or not the input is ESD is difficult to determine, and thus a RC circuit is not used.

Figure 2D:
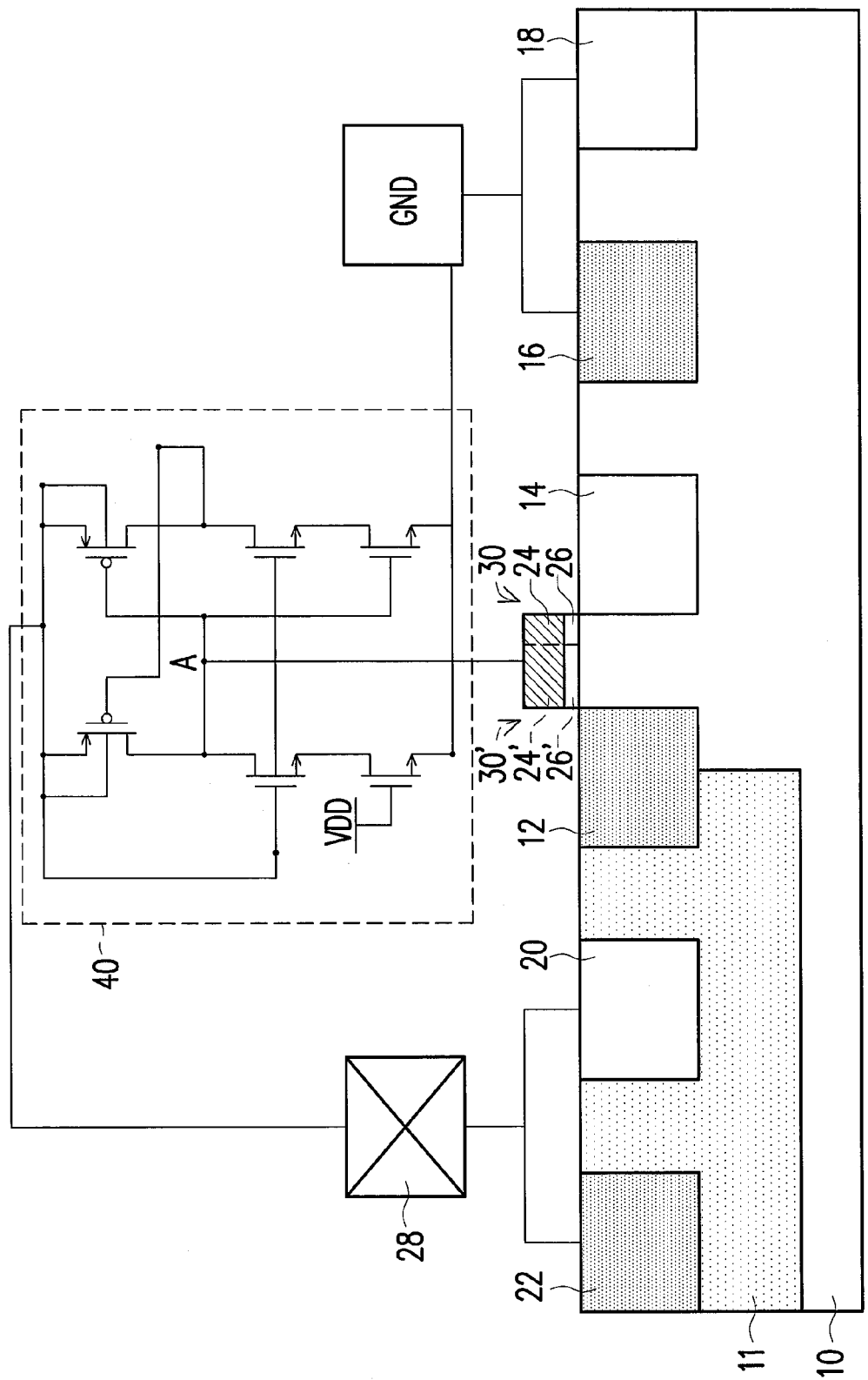
FIG. 2D schematically illustrates a circuit application of the ESD protection device of this invention.

FIG. 2D schematically illustrates a circuit application of the ESD protection device of this invention.

The VDD Controlled circuit 40 shown in FIG. 2D is an example of the application of the device of this invention. In normal operation, VDD is provided, and the node A and the gate 24 are grounded. When ESD occurs, the VDD terminal is floated, and the potential of the node A becomes a high potential (H), so that the high potential is applied to the gate 24 trigger the SCR device.

Accordingly, for the ESD protection device of any of the embodiments of this invention is not triggered by an N-type MOS transistor, there is no risk that a parasitic NPN diode is turned to damage the N-type MOS transistor. Hence, it is not necessary to set a large DCGS (Drain Contact to Gate Spacing) to avoid junction burning out. The ESD protection device of any of the embodiments of this invention not only allows the SRC thereof to be triggered more rapidly, but also allows reduction of the distance between the anode and the cathode to save the layout area, without adversely affecting the turn-on speed.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. An electrostatic discharge (ESD) protection device, comprising:
    a substrate of a first conductivity type;
    a well of a second conductivity type in the substrate, wherein the second conductivity type and the first conductivity type are different;
    a transistor comprising:
    a first doped region of the second conductive type, located in the substrate and extending into the well;
    a second doped region of the first conductive type, located in the substrate and neighboring to the first doped region, wherein a dopant concentration of the second doped region is higher than a dopant concentration of the substrate which is between the first doped region and the second doped region; and
    a gate over the substrate which is between and directly adjacent to the first doped region and the second doped region in a top view;
    a third doped region of the second conductivity type in the substrate;
    a fourth doped region of the first conductivity type in the substrate, wherein the third doped region is located between the second doped region and the fourth doped region;
    a fifth doped region of the first conductivity type in the well; and
    a sixth doped region of the second conductivity type in the well, wherein the fifth doped region is located between the first doped region and the sixth doped region,
    wherein the fifth doped region and the sixth doped region are electrically connected to a bonding pad, and the third doped region and the fourth doped region are electrically connected to a ground terminal; and
    the gate is electrically connected to the bonding pad through a capacitor C and the ground terminal through a resistor R.

2. The ESD protection device of claim 1, wherein there is a distance between the gate and the second doped region.

3. The ESD protection device of claim 2, wherein the transistor further comprises a light doped region that has the same conductivity type as the second doped region and is located in the substrate between the gate and the second doped region.

4. The ESD protection device of claim 1, wherein the gate is located adjacent to or overlapping with the second doped region.

5. The ESD protection device of claim 1, wherein the sixth doped region, the well, the first doped region, the second doped region, the substrate and the fourth doped region constitute a first discharge path.

6. The ESD protection device of claim 1, wherein the fifth doped region, the well, the substrate and the third doped region constitute a second discharge path.

7. The ESD protection device of claim 1, wherein the first conductivity type is P-type and the second conductivity type is N-type.

8. The ESD protection device of claim 1, wherein when an ESD voltage is applied to the bonding pad, the ESD voltage is coupled to the gate.

9. An electrostatic discharge (ESD) protection device, comprising:
- a substrate of a first conductivity type;
- a well of a second conductivity type in the substrate;
- a transistor comprising:
- a first doped region of the second conductivity type, located in the substrate and extending into the well;
- a second doped region of the first conductivity type, located in the substrate and neighboring to the first doped region, wherein a dopant concentration of the second doped region is higher than a dopant concentration of the substrate which is between the first doped region and the second doped region; and
- a gate over the substrate which is between and directly adjacent to the first doped region and the second doped region in a top view;
- a third doped region of the second conductivity type in the substrate;
- a fourth doped region of the first conductivity type in the substrate, wherein the third doped region is located between the second doped region and the fourth doped region;
- a fifth doped region of the first conductivity type in the well; and
- a sixth doped region of the second conductivity type in the well, wherein the fifth doped region is located between the first doped region and the sixth doped region,
- wherein the fifth doped region and the sixth doped region are coupled to a bonding pad, the bonding pad is coupled to a ground terminal and the gate via a circuit, the third doped region and the fourth doped region coupled to the ground terminal, and when an ESD voltage is applied to the bonding pad, the ESD voltage is coupled to the gate; and
- the gate is electrically connected to the bonding pad through a capacitor C and the ground terminal through a resistor R.

10. The ESD protection device of claim 9, wherein the circuit comprises an RC circuit including the capacitor C and the resistor R, and the gate is coupled to a node where the capacitor C and the resistor R is connected.

11. The ESD protection device of claim 9, wherein the circuit comprises a control circuit.

12. The ESD protection device of claim 9, wherein there is a distance between the gate and the second doped region.

13. The ESD protection device of claim 12, wherein the transistor further comprises a light doped region of the first conductivity type in the substrate between the gate and the second doped region.

14. The ESD protection device of claim 9, wherein the gate is located adjacent to or overlapping with the second doped region.

15. The ESD protection device of claim 9, wherein the sixth doped region, the well, the first doped region, the second doped region, the substrate and the fourth doped region constitute a first discharge path.

16. The ESD protection device of claim 9, wherein the fifth doped region, the well, the substrate and the third doped region constitute a second discharge path.

17. The ESD protection device of claim 9, wherein the first conductivity type is P-type and the second conductivity type is N-type.

18. The ESD protection device of claim 9, wherein the well is not extended to an extent under the second doped region.

* * * * *